US010921358B2

(12) United States Patent
Lai

(10) Patent No.: US 10,921,358 B2
(45) Date of Patent: Feb. 16, 2021

(54) CLEANING METHODS FOR PROBE CARDS

(71) Applicant: WINBOND ELECTRONICS CORP., Taichung (TW)

(72) Inventor: Chih-Chiang Lai, Hsinchu (TW)

(73) Assignee: Winbond Electronics Corp., Taichung (TW)

( * ) Notice: Subject to any disclaimer, the term of this patent is extended or adjusted under 35 U.S.C. 154(b) by 77 days.

(21) Appl. No.: 16/526,573

(22) Filed: Jul. 30, 2019

(65) Prior Publication Data

US 2020/0041552 A1 Feb. 6, 2020

(30) Foreign Application Priority Data

Jul. 31, 2018 (TW) .............................. 107126488 A

(51) Int. Cl.
*G01R 27/20* (2006.01)
*B08B 7/00* (2006.01)
*G01R 1/073* (2006.01)

(52) U.S. Cl.
CPC .......... *G01R 27/205* (2013.01); *B08B 7/0028* (2013.01); *G01R 1/07307* (2013.01)

(58) Field of Classification Search
CPC G01B 27/205; B08B 7/0028; G01R 1/07307; G01R 1/06794
USPC ................................... 324/750.01, 537, 500
See application file for complete search history.

(56) References Cited

U.S. PATENT DOCUMENTS

| 2006/0144423 | A1 | 7/2006 | Tan | |
| 2013/0127452 | A1* | 5/2013 | Boenisch | G01N 27/9033 324/242 |
| 2016/0349213 | A1* | 12/2016 | Kollgaard | G01N 27/904 |
| 2017/0030867 | A1* | 2/2017 | Faucher | G01N 29/041 |

FOREIGN PATENT DOCUMENTS

| CN | 104062574 A | 9/2014 |
| TW | 200842639 A | 11/2008 |

* cited by examiner

*Primary Examiner* — Giovanni Astacio-Oquendo
(74) *Attorney, Agent, or Firm* — Muncy, Geissler, Olds & Lowe, P.C.

(57) ABSTRACT

A testing system for testing a device under test including a plurality of circuits under test includes a probe card, testing apparatus, and a controller. The probe card includes a plurality of probes temporarily coupled to the circuits under test. The testing apparatus holds the probe card and tests the circuits under test through tine probe card. The controller controls the testing apparatus and executes a testing procedure that includes: measuring the contact resistance values between the probe card and each of the circuits under test; determining a statistical value of the contact resistance values; determining whether the statistical value exceeds a first threshold; when the statistical value does not exceed the first threshold, setting a clean flag to be in a first state; otherwise, setting the clean flag to be in a second state; and performing a clean operation on the probes according to the clean flag.

16 Claims, 6 Drawing Sheets

CLEANING METHODS FOR PROBE CARDS

CROSS REFERENCE TO RELATED APPLICATIONS

This Application claims priority of Taiwan Patent Application No. 107126488, filed on Jul. 31, 2018, the entirety of which is incorporated by reference herein.

BACKGROUND OF THE INVENTION

Field of the Invention

The disclosure relates generally to testing systems and methods thereof, and more particularly it relates to testing systems and methods thereof that intelligently select the proper cleaning formula to optimize automatic needle-cleaning.

Description of the Related Art

The stability of testing a wafer is directly related to the condition and setting of a probe card. This is especially true that the testing quality and the yield of testing a wafer significantly depend on the contact resistance among the probe tips of the probes and the probe pads on the wafer. However, contact resistance can also be determined by the cleanliness and the shape of the probe tips. In order to improve the quality and yield of testing wafers, it is necessary to clean the probe tips using a cleaning procedure and to reshape the probe tips.

There are roughly two types of cleaning procedures: online cleaning and offline cleaning. Online cleaning is much aster but just able to recover the probes back to a certain level for the following test. Even though offline cleaning can be used to deal with all kinds of situations, it takes a lot of time, which causes the overall testing period to be prolonged and the cost to be significantly increased.

In addition, the parameters that are measured by testing the known good dies include some parameters that require particularly high contact quality among the probes and the devices under test, such as speed and other rigorous parameters. The yield may suffer significantly if there is not a good cleaning mechanism.

Therefore, a more efficient cleaning procedure is required to dynamically maintain the contact resistance of the probes on the probe card in the required specifications, in order to ensure the testing quality and improve the yield.

BRIEF SUMMARY OF THE INVENTION

In an embodiment, a testing system for testing a device under test is provided. The device under test comprises a plurality of circuits under test. The testing system comprises: a probe card, testing equipment, and a controller, The probe card comprises a plurality of probes. The probes are configured to be temporarily coupled to the circuits under test. The testing equipment holds the probe card and tests the circuits under test through the probe card. The controller controls the testing equipment and executes a testing method. The testing method comprises: measuring contact resistance values between the probe card and each of the circuits under test; determining a statistical value of the contact resistance values; determining whether the statistical value exceeds a first threshold; when the statistical value does not exceed the first threshold, setting a cleaning flag to be in a first state; when the statistical value exceeds the first threshold, setting the cleaning flag to be in a second state; and performing a cleaning operation on the probes according to the cleaning flag.

According to an embodiment of the invention, after the step of measuring the contact resistance values between the probe card and each of the circuits under test, the testing procedure further comprises: increasing a contact count of the probe card and the device under test by 1; determining whether the contact count exceeds a second threshold; and when the contact count does not exceed the second threshold and the statistical value exceeds the first threshold, setting the cleaning flag to be in a third state.

According to an embodiment of the invention, after the step of setting the cleaning flag to be in the second state and the step of setting the cleaning flag to be in the third state, the controller further executes a measuring procedure, wherein the measuring procedure comprises: selecting one of the circuits under test to be a selected circuit under test; measuring a plurality of electrical parameters of the selected circuit under test, determining whether measuring the electrical parameters was successful; when measuring the electrical parameters was not successful, increasing a successive fail-measuring count by 1; determining whether the successive fail-measuring count exceeds a third threshold; when the successive fail-measuring count does not exceed the third threshold, measuring the electrical parameters of the selected circuit under test again, when the successive fail-measuring count exceeds the third threshold, performing the cleaning operation on the probes; when measuring the electrical parameters was successful, resetting the successive fail-measuring count to zero; selecting a subsequent circuit under test to be the selected. circuit under test; and measuring the electrical parameters of the selected circuit under test.

According to an embodiment of the invention, the controller further executes a cleaning procedure. The cleaning procedure comprises: determining whether the cleaning flag. is in one of the first state, the second state, and the third state; when the cleaning flag is in the first state, not performing the cleaning operation on the probes; when the cleaning flag is in the second state, selecting a first cleaning formula; performing the cleaning operation on the probes according to the first cleaning formula, wherein the first cleaning formula is configured to grind off particles and a carbonization layer on the tips of the probes; when the cleaning flag is in the third state, selecting a second cleaning formula; performing the cleaning operation on the probes according to the second cleaning formula, wherein the second cleaning formula is configured to grind off particles on sides of the probes and to sharpen the tips of the probes; and when the cleaning operation is performed, resetting the contact count and the cleaning flag to zero.

According to an embodiment of the invention, the cleaning procedure further comprises: when the successive fail-measuring count exceeds the third threshold, selecting a third cleaning formula; and performing the cleaning operation on the probes according to the third cleaning, wherein the third cleaning formula is configured to remove particles on the probes by sticking.

According to an embodiment of the invention, the testing procedure further comprises: counting a successive contact count of the probe card and the device under test. The cleaning procedure further comprises: counting a cleaning count of the cleaning operation; determining a cleaning frequency according to the successive contact count and the cleaning count; determining whether the cleaning frequency exceeds a fourth threshold; when the cleaning frequency exceeds the fourth threshold, generating an alarm; determining whether the successive contact count exceeds a fifth threshold and when the successive contact count exceeds the fifth threshold, resetting the successive contact count and the cleaning count to zero.

According to an embodiment of the invention, the statistical value is a median of the contact resistance values.

According to another embodiment of the invention, the statistical value is an average number of the contact resistance values.

In another embodiment, a testing method adapted in a probe card is provided. The probe card is configured to measure a device under test comprising a plurality of circuits under test, and the probe card comprises a plurality of probes. The probes are temporarily coupled to the circuits under test. The testing method comprises: measuring contact resistance values of the probe card and each of the circuits under test; determining a statistical value of the contact resistance values; determining whether the statistical value exceeds a first threshold: when the statistical value does not exceed the first threshold, setting a cleaning flag to be in a first state; when the statistical value exceeds the first threshold, setting the cleaning flag to be in a second state; and performing a cleaning operation on the probes according to the cleaning flag.

According to an embodiment of the invention, after the step of measuring the contact resistance Values between the probe card and each of the circuits under test, the testing method further comprises: increasing a contact count of the probe card and the device under test by 1; determining whether the contact count exceeds a second threshold; and when the contact count does not exceed the second threshold and the statistical value exceeds the first threshold, setting the cleaning flag to be in a third state.

According to an embodiment of the invention, after the step of setting the cleaning flag to be in the second state and the step of setting the cleaning flag to be in the third state, the testing method further comprises: selecting one of the circuits under test to be a selected circuit under test; measuring a plurality of electrical parameters of the selected circuit under test; determining whether measuring the electrical parameters was successful; when measuring the electrical parameters was not successful, increasing a successive fail-measuring count by 1; determining whether the successive fail-measuring count exceeds a third threshold; when the successive fail-measuring count does not exceed the third threshold, measuring the electrical parameters of the selected circuit under test again; when the successive fail-measuring count exceeds the third threshold, performing the cleaning operation on the probes; when measuring the electrical parameters was successful, resetting the successive fail-measuring count to zero; selecting a subsequent circuit under test to be the selected circuit under test; and measuring the electrical parameters of the selected circuit under test.

According to an embodiment of the invention, the testing method further comprises: determining whether the cleaning flag is in one of the first state, the second state, and the third state; when the cleaning flag is in the first state, not performing the cleaning operation on the probes; when the cleaning flag is in the second state, selecting a first cleaning formula; performing the cleaning operation on the probes according to the first cleaning formula, wherein the first cleaning formula is configured to grind off particles and a carbonization layer on the tips of the probes; when the cleaning flag is in the third state, selecting a second cleaning formula; performing the cleaning operation on the probes according to the second cleaning formula, wherein the second cleaning formula is configured to grind off particles on sides of the probes and to sharpen the tips of the probes; and when the cleaning operation is performed, resetting the contact count and the cleaning flag to zero.

According to an embodiment of the invention, the cleaning procedure further comprises: when the successive fail-measuring count exceeds the third threshold, selecting a third cleaning formula; and performing the cleaning operation on the probes according to the third cleaning, wherein the third cleaning formula is configured to remove particles on the probes by sticking.

According to an embodiment of the invention, the testing method further comprises: counting a successive contact count of the probe card and the device under test; counting a cleaning count of the cleaning operation; determining a cleaning frequency according to the successive contact count and the cleaning count; determining whether the cleaning frequency exceeds a fourth threshold; when the cleaning frequency exceeds the fourth threshold, generating an alarm; determining whether the successive contact count exceeds a fifth threshold; and when the successive contact count exceeds the fifth threshold, resetting the successive contact count and the cleaning count to zero.

According to an embodiment of the invention, the statistical value is a median of the contact resistance values.

According to another embodiment of the invention, the statistical value is an average number of the contact resistance values.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
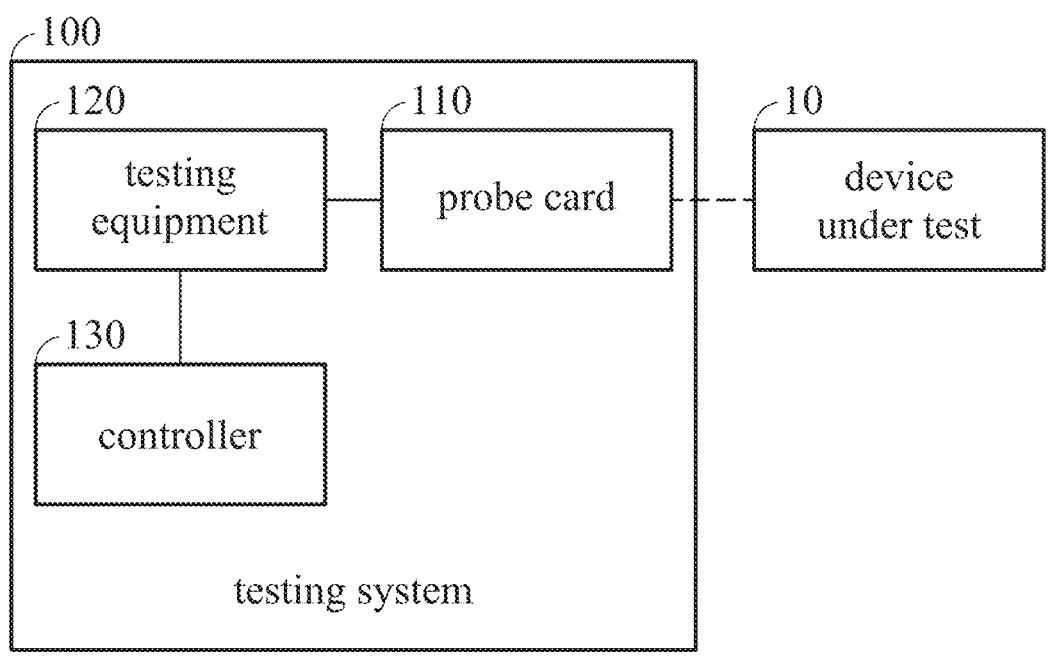
FIG. 1 is a block diagram of a testing system in accordance with an embodiment of the invention.

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It should be understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

FIG. 1 is a block diagram of a testing system in accordance with an embodiment of the invention. As show in FIG. 1, the testing system 100 is coupled to a device under test 10. The testing system 100 includes a probe card 110, testing equipment 120, and a controller 130. The device under test 10 includes a plurality of circuits under test, in which the testing system 100 is configured to test and measure the circuits of the device under test 10. According to an embodiment of the invention, the device under test 10 is a wafer, and the circuits under test are the circuits fabricated on the wafer.

The probe card 110 includes a plurality of probes, in which the probes are configured to be electrically coupled to the circuits under test of the device under test 10. According to an embodiment of the invention, each of the circuits under test of the device under test 10 has a plurality of probe pads. The probes of the probe card 110 are configured to be temporarily coupled to the probe pads for measuring the electrical parameters of at least one of the circuits under test. In addition, when the measurement is finished, the probes of the probe card 110 can be electrically separated from the probe pads and move to the next circuit under test.

According to an embodiment of the invention, when the probes of the probe card 110 are in contact with the device under test 10, the electrical parameters of one of the circuits under test can be measured. According to another embodiment of the invention, when the probes of the probe card 110 are in contact with the device under test 10, the electrical parameters of a predetermined number of circuits under test can be measured, in which the predetermined number can be determined by the designer.

The testing equipment 120 holds the probe card 110 and tests the circuits under test of the device under test 10 by the probes of the probe card 110. The controller 130 is configured to control the testing equipment 120 to test the electrical parameters of the circuits under test of the device under test 10. According to an embodiment of the invention, the controller 130 is configured to control the testing equipment 120 to apply the testing conditions to each of the circuits under test of the device under test 10 through the probe card 110 and to record the electrical parameters of the circuits under test under the applied testing conditions.

According to an embodiment of the invention, when the controller 130 controls the testing equipment 120 to measure the electrical parameters of the circuits under test of the device under test 10, the controller 130 executes a testing method. The testing method will be described in detail in the following paragraphs.

Figure 2:
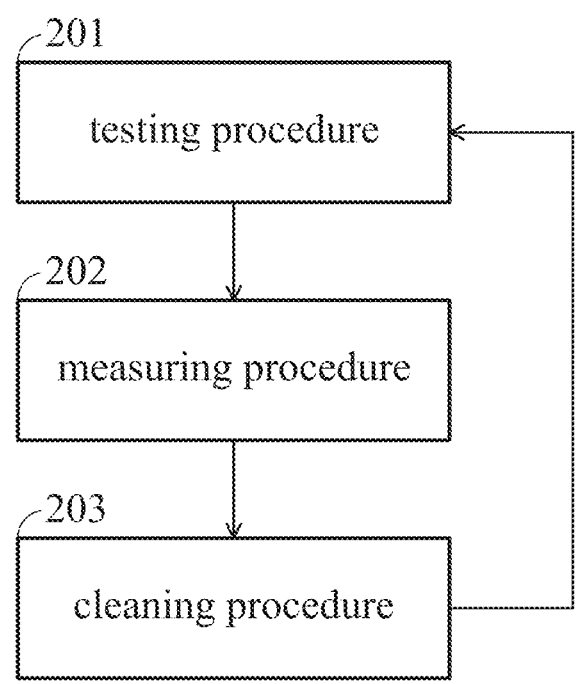
FIG. 2 is a flow chart of a testing method in accordance with an embodiment of the invention.

FIG. 2 is a flow chart of a testing method in accordance with an embodiment of the invention. The following description of the testing method is accompanied by FIG. 1 for the convenience of explanation. As shown in FIG. 2, the testing method 200 includes a testing procedure 201, a measuring procedure 202, and a cleaning procedure 203. The testing procedure 201 is configured to measure the contact resistance values between the probe card 110 and the device under test 10 and to determine the state of the probes of the probe card 110 based on the contact resistance values.

The measuring procedure 202 is configured to measure the electrical parameters of the circuits under test of the device under test 10. The cleaning procedure 203 is configured to select a corresponding cleaning formula according to the states of the probes of the probe card 110 for executing a cleaning operation on the probes. The testing procedure 201, the measuring procedure 202, and the cleaning procedure 203 will be described in detail in the following paragraphs.

Figure 3:
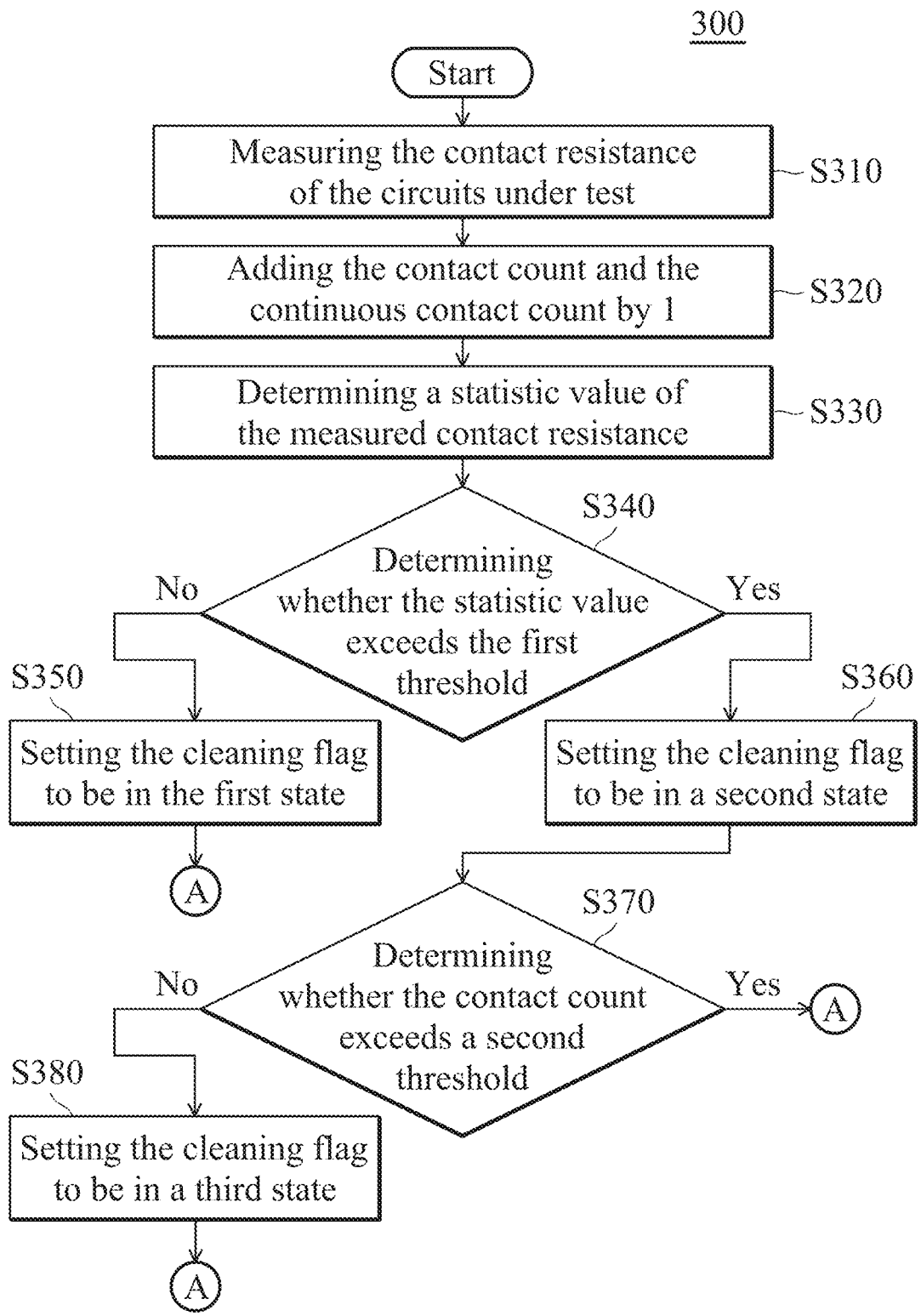
FIG. 3 is a flow chart of a testing procedure in accordance with an embodiment of the invention.

FIG. 3 is a flow chart of a testing procedure in accordance with an embodiment of the invention. The testing procedure 300 in FIG. 3 corresponds to the testing procedure 201 in FIG. 2. The contact resistance values of the circuits under test of the device under test 10 are measured (Step S310). When the contact resistance values of the circuits under test are measured, the contact count and the successive contact count are increased by 1 (Step S320). The contact count and the successive contact count are described in detail in the following paragraphs.

The testing system 100 measures the contact resistance values of a predetermined number of circuits under test. When the contact resistance values of the circuits under test are measured, the contact count is immediately increased by 1. The predetermined number is determined by the engineer. For example, when the probe card 110 is in contact with the device under test 10, the testing system 100 may simultaneously measure the predetermined number of circuits under test, in which the predetermined number is 1 or an integer greater than 1, and the contact count indicates the number of times that the probe card 110 has made contact with the device under test 10.

For example, it is assumed that the predetermined number is 1. When the testing system 100 measures one circuit under test, the contact count is increased by 1. It is assumed that the predetermined number is 10. When the testing system 100 measures 10 circuits under test, the contact count is increased by 1. Since the contact count is reset to zero after the cleaning operation, the contact count also indicates the number of times that the probe card 110 has made contact with the device under test 10.

Then, the controller 130 determines the statistical value of the measured contact resistance values (Step S330). According to an embodiment of the invention, the statistical value is the median of the measured contact resistance values. According to another embodiment of the invention, the statistical value is the average number of the measured contact resistance values. According to other embodiments of the invention, the statistical value may be other values that are meaningful in statistics. When the testing system 100 obtains the contact resistance values of the predetermined number of circuits under test, the controller 130 determines the statistical value of the contact resistance values of the predetermined number of circuits under test, in which the predetermined number is 1 or an integer greater than 1. The controller 130 further determines whether the statistical value exceeds the first threshold (Step S340). When the statistical value does not exceed the first threshold, the controller 130 sets the cleaning flag to be in a first state (Step S350) and begins to execute the measuring procedure 202 in FIG. 2. When the statistical value exceeds the first threshold, the controller 130 sets the cleaning flag to be in a second state (Step S360).

Then, when it is determined in Step S340 that the statistical value exceeds the first threshold, the controller 130 further determines whether the contact count exceeds a second threshold (Step S370). When it is determined that the contact count does not exceed the second threshold, the controller 130 sets the cleaning flag to be in a third state (Step S380) and begins to execute the measuring procedure 202. When it is determined that the contact count exceeds the second threshold, the controller 130 ends the testing procedure 300 and begins to execute the measuring procedure 202 in FIG. 2.

The contact count indicates the number of times that the probe card 110 made contact with the device under test 10 after executing the cleaning operation. When the controller 130 determines that the statistical value exceeds the first threshold and the contact count does not exceed the second threshold, it indicates that the cleaning frequency has been raised and reached the critical point. The detailed cleaning formula will be described in the cleaning procedure.

Figure 4:
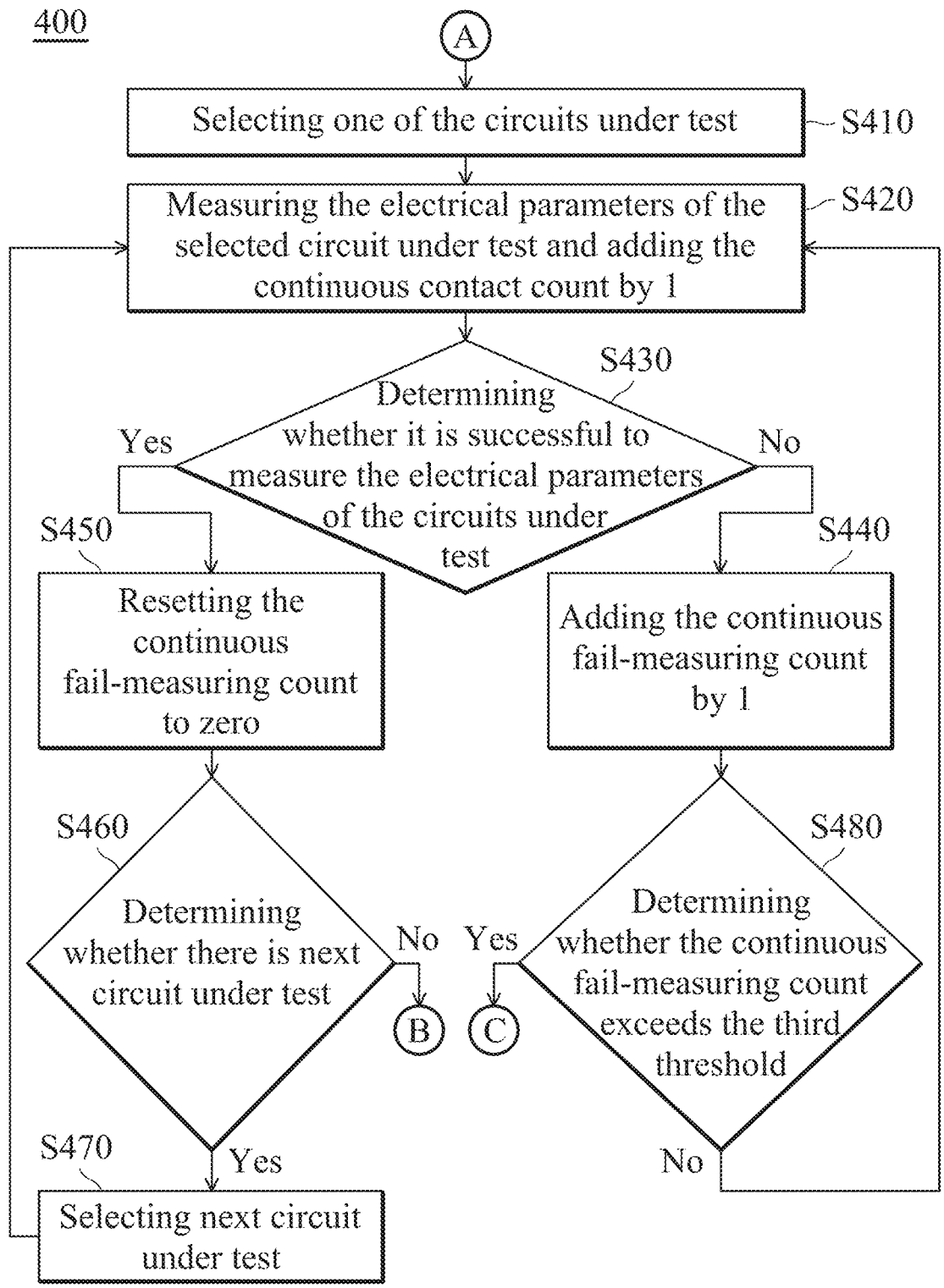
FIG. 4 is a flow chart of a measuring procedure in accordance with an embodiment of the invention.

FIG. 4 is a flow chart of a measuring procedure in accordance with an embodiment of the invention. The measuring procedure 400 in FIG. 4 corresponds to the measuring procedure 202 in FIG. 2. When the controller 130 determines that the contact count exceeds the second threshold in Step S370 in FIG. 3, the controller 130 ends the testing procedure 300 and selects at least one of the circuits under test of the device under test 10 (Step S410).

According to an embodiment of the invention, the testing system 100 measures the contact resistance values of the predetermined number of circuits under test in Step S310. Therefore, the controller 130 selects at least one circuit from the predetermined number of circuits under test to be the selected circuit under test in Step S410, and measures the electrical parameters of the selected circuit under test in Step S420. According to other embodiments of the invention, the testing system 100 may select one or more circuits under test in Step S410 and simultaneously measure the electrical parameters of the selected one or more circuits under test in Step S420. The number of selected circuits under test is determined by the real condition of the probe card 110 but not intended to be limited thereto.

Then, the controller 130 determines whether measuring the electrical parameters of the circuits under test was successful (Step S430). When the controller 130 determines that measuring the electrical parameters of the circuits under test was not successful, the controller 130 increases the successive fail-measuring count of area in the probe card corresponding to circuits under test by 1 (Step S440). When the controller 130 determines that measuring the electrical parameters of the circuits under test was successful, the controller 130 resets the successive fail-measuring count to zero (Step S450). The successive fail-measuring count indicates the number of times that the same circuits under test of the device under test 10 are in successive contact with the probe card 110 but the measurement fails. When it is determined to be successful in Step S430, Step S450 is executed and the successive fail-measuring count of the area in the probe card 110 corresponding to the circuits under test is reset to zero.

The method returns to Step S450. When the successive fail-measuring count is reset to zero, the controller 130 determines whether there is a subsequent circuit under test (Step S460). When it is determined that there is not a subsequent circuit under test, the controller 130 executes the cleaning procedure 203 in FIG. 2. When it is determined that there is not a subsequent circuit under test, the controller 130 selects the next circuit under test (Step S470), and returns to Step S420.

According to an embodiment of the invention, the testing system 100 measures the contact resistance values of the predetermined number of circuits under test in Step S310. The controller 130 determines, in Step S460, whether there is a circuit under test in the predetermined number of circuits under test that has not been executed the measurement in Step S420. When the controller 130 determines, in Step S460, that all the predetermined number of circuits under test have been executed the measurement in Step S420, the controller 130 executes the cleaning procedure 203 in FIG. 2.

When the controller 130 determines, in Step S460, that there is a circuit under test in the predetermined number of circuits under test that has not been executed the measurement in Step S420, the controller 130 selects the next circuit in the predetermined number of circuits under test to execute the measurement of Step S420. According to an embodiment of the invention, the controller 130 may select one or more circuits under test, in which the number of selected circuits under test is determined by the real condition of the probe card 110, but not intended to be limited thereto.

The method returns to Step S440. When it is determined that measuring the electrical parameters was unsuccessful and the successive fail-measuring count corresponding to the circuits under test is increased by 1, the controller 130 then determines whether the successive fail-measuring count exceeds the third threshold (Step S480). When it is determined in Step S480 that the successive fail-measuring count exceeds the third threshold, the controller 130 executes the cleaning procedure 203 in FIG. 2. When it is determined that the successive fail-measuring count does not exceed the third threshold, the controller 130 performs Step S420 on those unfinished circuits under test.

For example, the third threshold is 3. According to an embodiment of the invention, when the successive fail-measuring count does not exceed 3, it indicates that the fouling conditions of the probes of the probe card 110 are not serious. When the successive fail-measuring count exceeds 3, it indicates that the fouling conditions of the probes of the probe card 110 are not negligible. Therefore, the cleaning procedure 203 in FIG. 2 is executed immediately.

Figure 5A:
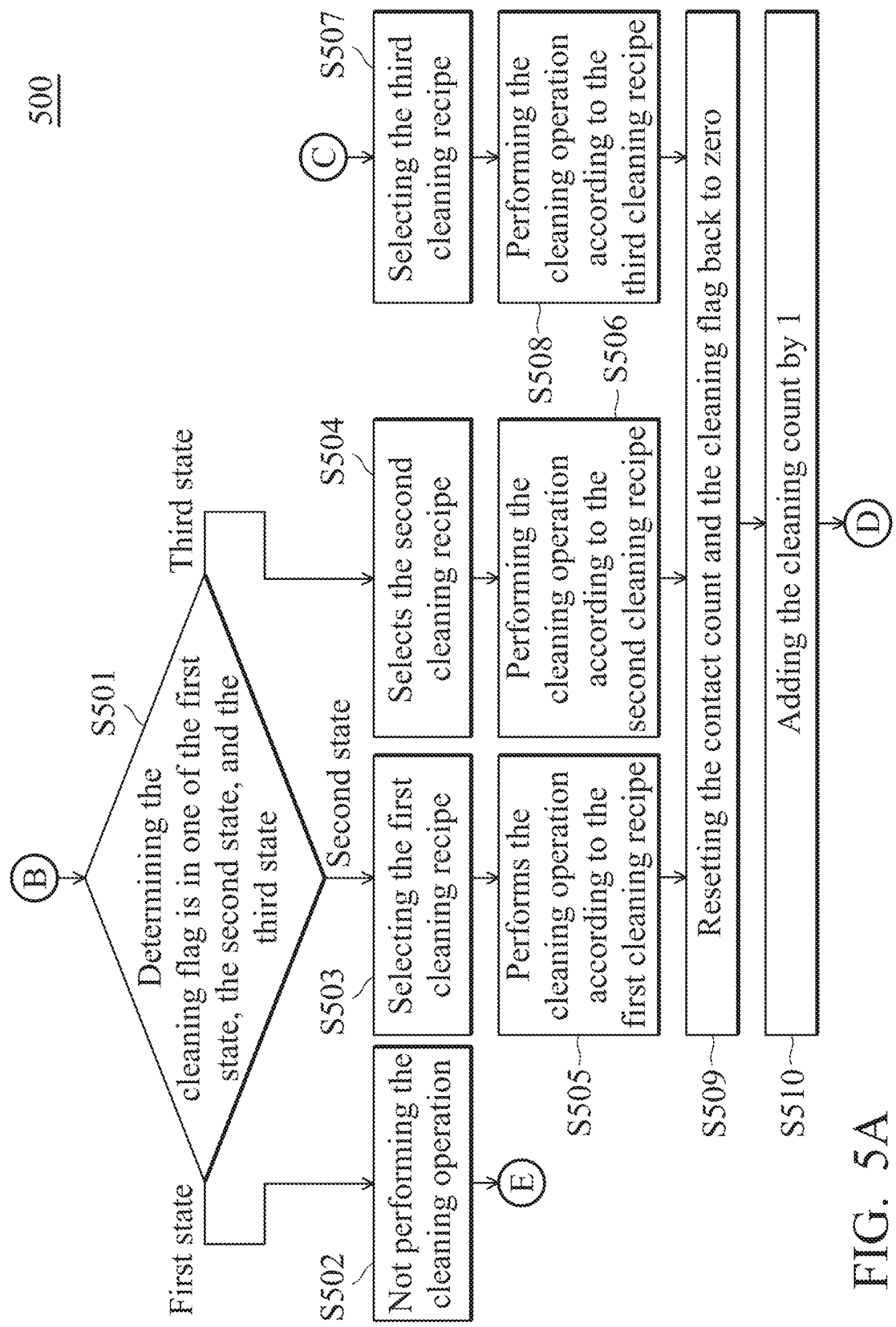
FIGS. 5A-5B show a flow chart of a cleaning procedure in accordance with an embodiment of the invention.
Figure 5B:
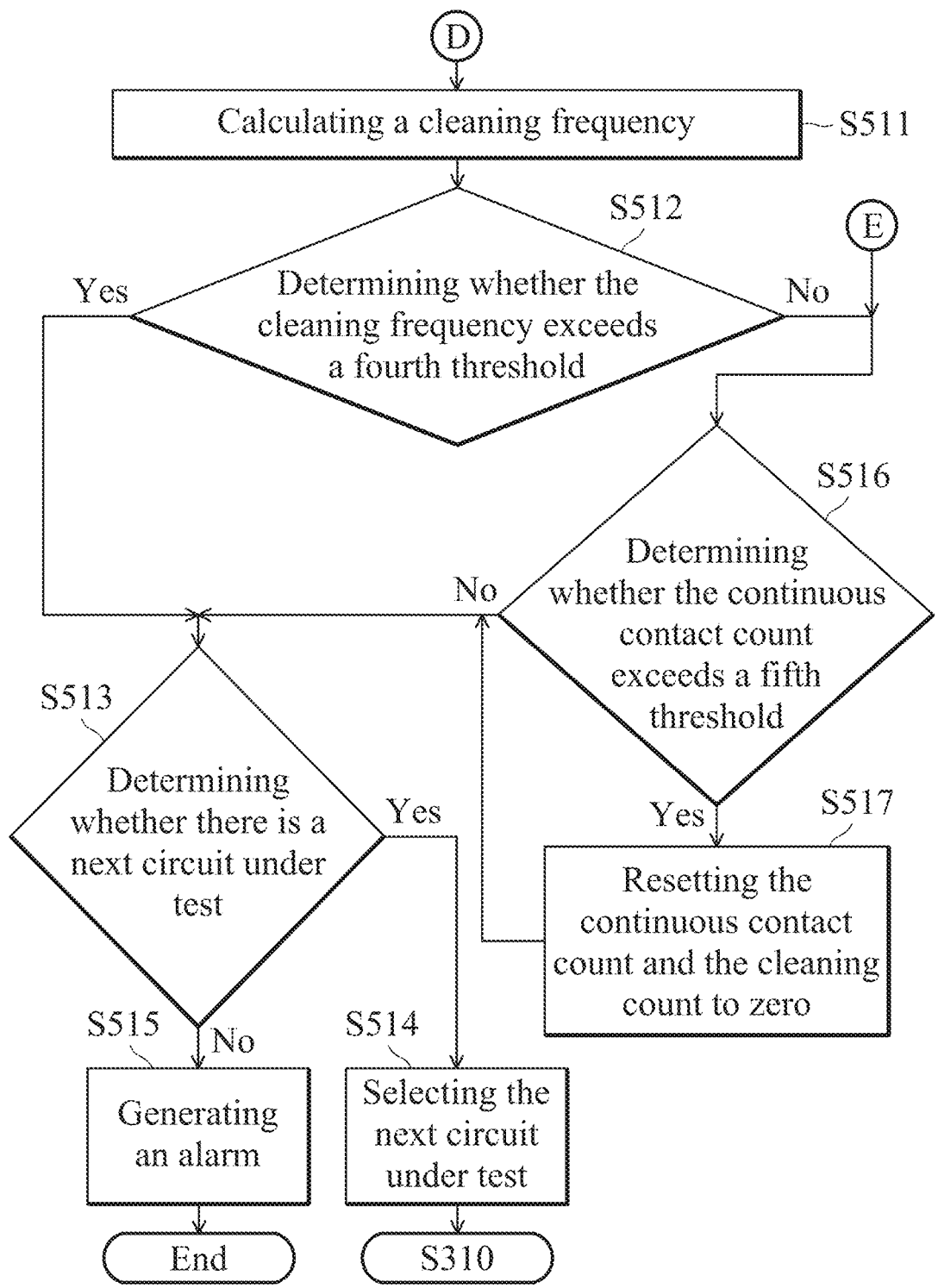

FIGS. 5A-5B show a flow chart of a cleaning procedure in accordance with an embodiment of the invention. The cleaning procedure 500 in FIGS. 5A-5B corresponds to the cleaning procedure 203 in FIG. 2.

The method returns to Step S460 in FIG. 4. When the controller 130 determines in Step S460 that there is no subsequent circuit under test, the controller 130 begins to execute the cleaning procedure 500. The controller 130 determines the cleaning flag is in one of the first state, the second state, and the third state (Step S501).

When the cleaning flag is determined to be in the tint state, the controller 130 does not perform the cleaning operation on the probes of the probe card 110 (Step S502). When the cleaning flag is in the second state, the controller 130 selects the first cleaning formula (Step S503) and performs the cleaning operation on the probes of the probe card 110 according to the first cleaning formula (Step S505). A cleaning plate with a high wear coefficient is adopted in the first recipe, which is configured to grind off the particles and the carbonization layer from the probes' tips of the probe card 110.

When the cleaning flag is in the third state, the controller 130 selects a second cleaning formula (Step S504), and performs the cleaning operation on the probes of the probe card 110 according to the second cleaning formula (Step S506).

According to an embodiment of the invention, a cleaning plate with a low wear coefficient and a high sticking coefficient is adopted in the second cleaning recipe, which is configured to stick the particles on the sides of the probes of the probe card 110 and to sharpen the tips of the probes.

According to an embodiment of the invention, when the controller 130 determines in Step S340 that the statistical value does not exceed the first threshold and the cleaning flag is set to be in the first state in Step S350, it indicates that the contact resistance values measured by the controller 130 in Step S310 is normal such that the cleaning operation could not be performed on the probes of the probe card 110.

According to another embodiment of the invention, when the controller 130 determines in Step S340 that the statistical value exceeds the first threshold and the cleaning flag is set to be in the second state in Step S360, this indicates that the contact resistance values measured by the controller 130 in Step S310 are too high and that the tip of the probes of the probe card 110 may be contaminated with particles causing them to be deformed. Therefore, the controller 130 set the cleaning flag to be in the second state in Step S360, and grinds off the particles and the carbonization layer from the tips of the probes of the probe card 110 according to the first cleaning recipe in Step S505.

According to yet another embodiment of the invention, when the controller 130 determines that the statistical value exceeds the first threshold and that the contact count does not exceed the second threshold such that the cleaning flag is set to be in the third state in Step S380, it indicates that the tips of the probes of the probe card 110 may be flattened due to abrasion, or that some particles may be stuck to the sides of the probes of the probe card 110. Therefore, the controller 130, in Step S506, removes the particles on the sides of the probes of the probe card 110 and sharpens the tips of the probes, according to the second cleaning recipe.

The method returns to Step S480 in FIG. 4. When the controller 130 determines in Step S480 that the successive fail-measuring count exceeds the third threshold, the controller 130 selects the third cleaning formula (Step S507), and performs the cleaning operation on the probes of the probe card 110 according to the third cleaning formula (Step S508). According to an embodiment of the invention, a cleaning plate with a high sticking coefficient is adopted in the third cleaning formula, which is configured to remove the particles stuck on the tips of the probes of the probe card 110.

According to an embodiment of the invention, when the successive fail-measuring count exceeds the third threshold, it indicates that the circuits under test have been successively failed to be measured for many times. It might be due to some particles sticking on the tip of some probes of the probe card 110. Therefore, the cleaning plate with a high sticking coefficient is adopted to remove the particles on the tips of the probes of the probe card 110.

When Step S505, Step S506, or Step S508 is finished, the controller 130 resets the contact count and the cleaning flag back to zero (Step S509). According to an embodiment of the invention, since the contact count is reset to zero after the cleaning operation is performed, the contact count is the number of times that the probe card 110 makes contact with the device under test 10 after the controller 130 performs the cleaning operation.

When Step S502 or Step S509 is finished, the controller 130 immediately adds the cleaning count by 1 (Step S510) and calculate a cleaning frequency (Step S511), According to an embodiment of the invention, the controller 130 calculates the cleaning frequency according to the successive contact count and the cleaning count counted in Step S320 in FIG. 3. Namely, the cleaning frequency is a ratio of the cleaning count to the successive contact count.

Then, the controller 130 further determines whether the cleaning frequency exceeds a fourth threshold (Step S512). When the cleaning frequency exceeds the fourth threshold, the controller 130 further determines whether there is a subsequent circuit under test in the device under test 10 (Step S513). When there is a subsequent circuit under test, the controller 130 selects the next circuit under test (Step S514) and returns to Step S310.

When there is no subsequent circuit under test, the controller 130 generates an alarm (Step S515). According to an embodiment of the invention, when the cleaning frequency exceeds the fourth threshold, this indicates that the frequency at which cleaning operations are performed on the probe card 110 is too high. Therefore, when there is no subsequent device under test 10. the controller 130 generates an alarm to instruct the engineer to examine the probe card 110 for the following test.

The method returns to Step S512. When the cleaning frequency does not exceed the fourth threshold, the controller 130 determines whether the successive contact count exceeds a fifth threshold (Step S516). When the successive contact count does not exceed the fifth threshold, the controller 130 determines whether there is a subsequent device under test 10 (Step S513). When the successive contact count exceeds the filth threshold, the controller 130 resets the successive contact count and the cleaning count to zero (Step S517), and then executes Step S513.

According to an embodiment of the invention, the successive contact count is configured to monitor the cleaning frequency behind the fifth threshold. Therefore, when the successive contact count exceeds the fifth threshold, the successive contact count and the cleaning count are reset to zero. Namely, the cleaning frequency is reset to zero for monitoring the cleaning frequency of the subsequent lot size of circuits under test. According to an embodiment of the invention, the contact count is reset to zero in Step S509. Specifically, the contact count is reset to zero after the cleaning operation (i.e., Step S505, Step S506, or Step S508) is performed. Therefore, the contact count is configured to count the number of times that the probe card 110 makes contact with the device under test 10 after the cleaning operation is performed.

According to an embodiment of the invention, Step S516 and Step S517 may be performed in parallel with any one step of the testing procedure 300, the measuring procedure 400, and the cleaning procedure 500. Namely, when the controller 130 performs any step of the testing method 200, the controller 130 can monitor whether the successive contact count exceeds the fifth threshold (Step S516) at any time and can immediately reset the successive contact count to zero (Step S517) when the successive contact count exceeds the fifth threshold.

Since the testing method provided herein is configured to perform the cleaning operation on the probes of the probe card with a corresponding cleaning formula according to the individual conditions, most of the situations that the probe card faces could be eliminated by online cleaning, in order to reduce the number of offline cleanings. Therefore, the time required for offline cleaning can be reduced. In addition, the testing method provided herein can more effectively maintain good contact quality between the probes and the circuits under test so that the loss of yield can be reduced.

While the invention has been described by way of example and in terms of preferred embodiment, it should be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A testing system for testing a device under test, wherein the device under test comprises a plurality of circuits under test, comprising:
  a probe card, comprising a plurality of probes, wherein the probes are configured to be temporarily coupled to the circuits under test;
  testing equipment, holding the probe card and testing the circuits under test through the probe card; and
  a controller, controlling the testing equipment and executing a testing method, wherein the testing method comprises:
    measuring contact resistance values between the probe card and each of the circuits under test;
    determining a statistical value of the contact resistance values;
    determining whether the statistical value exceeds a first threshold;
    when the statistical value does not exceed the first threshold, setting a cleaning flag to be in a first state;
    when the statistical value exceeds the first threshold, setting the cleaning flag to be in a second state; and
    performing a cleaning operation on the probes according to the cleaning flag.

2. The testing system of claim 1, wherein after the step of measuring the contact resistance values between the probe card and each of the circuits under test, the testing procedure further comprises:
  increasing a contact count of the probe card and the device under test by 1;
  determining whether the contact count exceeds a second threshold; and
  when the contact count does not exceed the second threshold and the statistical value exceeds the first threshold, setting the cleaning flag to be in a third state.

3. The testing system of claim 2, wherein after the step of setting the cleaning flag to be in the second state and the step of setting the cleaning flag to be in the third state, the controller further executes a measuring procedure, wherein the measuring procedure comprises:
  selecting one of the circuits under test to be a selected circuit under test;
  measuring a plurality of electrical parameters of the selected circuit under test;
  determining whether measuring the electrical parameters was successful;
  when measuring the electrical parameters was not successful, increasing a successive fail-measuring count by 1;
  determining whether the successive fail-measuring count exceeds a third threshold;
  when the successive fail-measuring count does not exceed the third threshold, measuring the electrical parameters of the selected circuit under test again;
  when the successive fail-measuring count exceeds the third threshold, performing the cleaning operation on the probes;
  when measuring the electrical parameters was successful, resetting the successive fail-measuring count to zero;
  selecting a subsequent circuit under test to be the selected circuit under test; and
  measuring the electrical parameters of the selected circuit under test.

4. The testing system of claim 3, wherein the controller further executes a cleaning procedure, wherein the cleaning procedure comprises:
  determining whether the cleaning flag is in one of the first state, the second state, and the third state;
  when the cleaning flag is in the first state, not performing the cleaning operation on the probes;
  when the cleaning flag is in the second state, selecting a first cleaning formula;
  performing the cleaning operation on the probes according to the first cleaning formula, wherein the first cleaning formula is configured to grind off particles and a carbonization layer on tips of the probes;
  when the cleaning flag is in the third state, selecting a second cleaning formula;
  performing the cleaning operation on the probes according to the second cleaning formula, wherein the second cleaning formula is configured to grind off particles on sides of the probes and to sharpen tips of the probes; and
  when the cleaning operation is performed, resetting the contact count and the cleaning flag to zero.

5. The testing system of claim 4, wherein the cleaning procedure further comprises:
  when the successive fail-measuring count exceeds the third threshold, selecting a third cleaning formula; and
  performing the cleaning operation on the probes according to the third cleaning, wherein the third cleaning formula is configured to remove particles on the probes.

6. The testing system of claim 4, wherein the testing procedure further comprises:
  counting a successive contact count of the probe card and the device under test;
  wherein the cleaning procedure further comprises:
    counting a cleaning count of the cleaning operation;
    determining a cleaning frequency according to the successive contact count and the cleaning count;
    determining whether the cleaning frequency exceeds a fourth threshold;
    when the cleaning frequency exceeds the fourth threshold, generating an alarm;
    determining whether the successive contact count exceeds a fifth threshold; and
    when the successive contact count exceeds the fifth threshold, resetting the successive contact count and the cleaning count to zero.

7. The testing system of claim 1, wherein e statistical value is a median of the contact resistance values.

8. The testing system of claim 1, wherein the statistical value is an average number of the contact resistance values.

9. A testing method adapted in a probe card, wherein the probe card is configured to measure a device under test comprising a plurality of circuits under test, and the probe card comprises a plurality of probes, wherein the probes are temporarily coupled to the circuits under test, wherein the testing method comprises:
  measuring contact resistance values of the probe card and each of the circuits under test;
  determining a statistical value of the contact resistance values;
  determining whether the statistical value exceeds a first threshold;
  when the statistical value does not exceed the first threshold, setting a cleaning flag to be in a first state;

when the statistical value exceeds the first threshold, setting the cleaning flag to be in a second state; and performing a cleaning operation on the probes according to the cleaning flag.

10. The testing method of claim 9, wherein after the step of measuring the contact resistance values between the probe card and each of the circuits under test, the testing method further comprises:

increasing the contact count of the probe card and the device under test by 1;

determining whether the contact count exceeds a second threshold; and when the contact count does not exceed the second threshold and the statistical value exceeds the first threshold, setting the cleaning flag to be in a third state.

11. The testing method of claim 10, wherein after the step of setting the cleaning flag to be in the second state and the step of setting the cleaning flag to be in the third state, the testing method further comprises:

selecting one of the circuits under test to be a selected circuit under test;

measuring a plurality of electrical parameters of the selected circuit under test;

determining whether measuring the electrical parameters was successful;

when measuring the electrical parameters was not successful, increasing a successive fail-measuring count by 1;

determining whether the successive fail-measuring count exceeds a third threshold;

when the successive fail-measuring count does not exceed the third threshold, measuring the electrical parameters of the selected circuit under test again;

when the successive fail-measuring count exceeds the third threshold, performing the cleaning operation on the probes;

when measuring the electrical parameters was successful, resetting the successive fail-measuring count to zero;

selecting a subsequent circuit under test to be the selected circuit under test, and measuring the electrical parameters of the selected circuit under test.

12. The testing method of claim 11, further comprising:

determining whether the cleaning flag is in one of the first state, the second state, and the third state;

when the cleaning flag is in the first state, not performing the cleaning operation on the probes;

when the cleaning flag is in the second state, selecting a first cleaning formula;

performing the cleaning operation on the probes according to the first cleaning formula, wherein the first cleaning formula is configured to grind off particles and a carbonization layer on tips of the probes;

when the cleaning flag is in the third state, selecting a second cleaning formula;

performing the cleaning operation on the probes according to the second cleaning formula, wherein the second cleaning formula is configured to grind off particles on sides of the probes and to sharpen tips of the probes; and when the cleaning operation is performed, resetting the contact count and the cleaning flag to zero.

13. The testing method of claim 12, wherein the cleaning procedure further comprises:

when the successive fail-measuring count exceeds the third threshold, selecting a third cleaning formula; and performing the cleaning operation on the probes according to the third cleaning, wherein the third cleaning formula is configured to remove particles on the probes by sticking.

14. The testing method of claim 12, further comprising:

counting a successive contact count of the probe card and the device under test;

counting a cleaning count of the cleaning operation;

determining a cleaning frequency according to the successive contact count and the cleaning count;

determining whether the cleaning frequency exceeds a fourth threshold;

when the cleaning frequency exceeds the fourth threshold, generating an alarm;

determining whether the successive contact count exceeds a fifth threshold; and when the successive contact count exceeds the fifth threshold, resetting the successive contact count and the cleaning count to zero.

15. The testing method of claim 9, wherein the statistical value is a median of the contact resistance values.

16. The testing method of claim 9, wherein the statistical value is an average number of the contact resistance values.

\* \* \* \* \*